OR    4,005,394

United States
Kiemle

[11] B    4,005,394
[45]    Jan. 25, 1977

[54] HOLOGRAPHIC STORAGE DEVICE

[75] Inventor: Horst Kiemle, Neuried, Germany

[73] Assignee: Siemens Aktiengesellschaft, Berlin & Munich, Germany; DT

[22] Filed: Mar. 20, 1974

[21] Appl. No.: 453,067

[44] Published under the second Trial Voluntary Protest Program on March 23, 1976 as document No. B 453,067.

[30]    Foreign Application Priority Data

Mar. 29, 1973    Germany .......................... 2315776

[52] U.S. Cl. .......................... 340/173 LM; 350/3.5
[51] Int. Cl.² ........................................ G11C 13/04
[58] Field of Search ............ 340/173 LM; 350/315

[56]    References Cited

UNITED STATES PATENTS

| | | | |
|---|---|---|---|
| 3,706,080 | 12/1972 | Lee ............... | 340/173 LM |
| 3,719,409 | 3/1973 | Vincelette .......... | 340/173 LM |
| 3,720,453 | 3/1973 | Lee ............... | 340/173 LM |
| 3,767,285 | 10/1973 | Mezrich ............ | 340/173 LM |
| 3,800,298 | 3/1974 | Oguru ............. | 340/173 LM |

*Primary Examiner*—Terrell W. Fears
*Attorney, Agent, or Firm*—Hill, Gross, Simpson, Van Santen, Steadman, Chiara & Simpson

[57]    ABSTRACT

A holographic storage device which is capable of enabling both recording of information to be stored and retrieving information characterized by a portion of a beam of coherent light being directed onto a subhologram of an illumination hologram to create an illuminating beam which is projected on a modulator matrix which creates an object wave that is projected onto the storage medium during a recording operation. The device further includes a detector matrix utilized during the retrieval operation and both the detector matrix and the modulator matrix are separated from the storage medium by transparent bodies having an index of refraction greater than 1. In one embodiment, at least two of the transparent bodies include light splitting or distribution surfaces which split off a portion of the beam passing therethrough, the illumination hologram is preferably a surface relief reflection hologram and a retrodirective mirror is utilized to direct the beam passing through the first beam splitter to a second beam splitter to be projected onto the storage medium. In a second embodiment, the coherent beam of light is projected through a transparent body, the storage medium and received by a retrodirective mirror which directs it on the illumination hologram. In this embodiment, the illumination hologram can be in the same plane as the storage medium and the modulator matrix is a reflective matrix to reflect the modulated object beam back onto the storage medium. In a similar arrangement of the embodiment, the modulator matrix is a transparent matrix and an additional transparent body is arranged on the opposite side thereof with the illumination hologram disposed on opposite surfaces.

10 Claims, 6 Drawing Figures

HOLOGRAPHIC STORAGE DEVICE

BACKGROUND OF THE INVENTION

1. Field of the Invention

The present invention relates to a holographic storage device which is capable of recording and retrieving information in sub-holograms and which utilizes an illumination hologram to create an illuminating beam which is modulated by a modulator matrix to create the object beam for holographic recording.

2. Prior Art

As computers have become more and more common the requirements for both greater storage capacity and more rapid access to information have become desirable. The storage in holographic form has been proposed which makes it possible to store information in greater density than that possible with prior storage techniques, as for example magnetic storage. It is known to spatially modulate coherent light and to store the data holographically. In such storage devices, any interference fringe system can be assigned one unit of binary data or 1 bit. The presence of the fringe system corresponds to a binary 1 and its absence to the binary 0.

With the aid of holograms it is possible to project an image to arbitrary positions in space without the assistance of optical elements. This gives rise to the basis of the possibility of constructing holographic storage devices with non-mechanical, random access memories which can have very large capacities. The use of holographic storage overcomes the problems related to tolerance which are of the mechanical-optical nature such as occur in other high capacity optical storage devices since the data output is obtained by interrogating an image with a relatively crude structure located outside of the hologram.

Each holographically stored bit corresponds to a single spot or point on an object surface whose associated interference field is uniformly stored on the entire hologram surface. Holographic storage is subsequently immune to interference, since local interferences on the hologram result merely in a slight reduction in the level of freedom of interference or a reduction in the signal-to-noise ratio. The spots or points are arranged in the form of a grid pattern and if this grid pattern is coherently illuminated from the side facing away from the hologram surface, the binary numbers can be recorded in parallel form onto the hologram.

If the data stored in such a structure are to be read out in parallel, a separate photo detector will be required for each bit position. Cost considerations normally make it prohibitive to provide a sufficient number of photo detectors to enable reading out in parallel the entire contents of a large capacity storage device. To overcome this problem it has been suggested that the storage area be subdivided into small sub-holograms or subsidiary holograms whose capacity is a fraction of the overall capacity of the storage medium. With each sub-hologram having a storage capacity in the magnitude of $10^3 - 10^5$ bits, the cost for providing a device capable of parallel read out for the entire contents of a sub-hologram is within reason. During read out, one sub-hologram or subsidiary hologram will be reconstructed at a time by being illuminated by a reproducing beam or read out beam having a cross-sectional area of the sub-hologram. The beam is directed over the entire storage surface by means of a deflecting unit so that selective subsidiary or sub-holograms can be read. In each storage medium, the capacity of the memory will be the product of the number of subsidiary or sub-holograms which number is determined by the number of separate and distinct beam directions that the deflection unit can produce, and the capacity of the sub-holograms. However, since the storage density of a non-mechanical holographic storage device is limited to a few $10^4$ bits per mm$^2$, a bulk storage medium containing about $10^{10}$ bits requires a storage area of about 1 m$^2$.

To overcome the problems of the large storage area required for storing a large number of bits, a solution is proposed in the U.S. Pat. application Ser. No. 453,922 filed Mar. 22, 1974 by Hans Eschler, Manfred Land, Gerd Goldmann, Peter Graf, Horst Kiemle and Ulrich v. Hundelshausen. In the application, the holographic storage device is provided in which data in quantities of more than $10^8$ bits can be read out without any difficulty. To accomplish this, the storage medium of the application is divided into a plurality of storage modules with each module consisting of a transparent body containing both a storage plate and a detector matrix. The recording of the information in each of the storage modules is accomplished in a separate recording device and then the module is mechanically transferred to the position in the holographic storage apparatus for subsequent retrieval or read out operation.

SUMMARY OF THE INVENTION

The present invention is to provide a holographic storage device in which information can be holographically recorded on the storage medium and retrieved without requiring movement of the storage medium from its position in the device. The holographic storage device of the present invention eliminates the time consuming transfer of the storage medium between a recording station or device and a read out or retrieval station and also eliminates the cost of providing a separate recording section or station.

To accomplish this, the device of the present invention utilizes a plurality of transparent bodies each having a plurality of flat surfaces, a storage medium disposed between a pair of said bodies which are arranged with their adjacent flat surfaces in parallel, a detector matrix arranged on a surface of one of the pair of bodies opposite the storage medium, a modulator matrix provided with a condenser-type optical system being disposed adjacent a flat surface of the other of said pair of bodies opposite the storage medium, an illumination hologram containing a plurality of sub-holograms spaced from the modulator matrix by one of the transparent bodies, a source providing a beam of coherent illumination directed at one of the bodies, means for selectively deflecting the beam on different portions of the body so that the deflected beam is selectively projected on different portions of the storage medium during both recording and retrieving operations, and means for directing a portion of the deflected beam onto the sub-holograms of the illumination hologram to create an illuminating beam which is projected on the modulator matrix which creates an object wave that is projected on the storage medium. The object wave containing the information coacts with the unmodulated beam to holographically record the information as a sub-hologram on a portion of the storage medium. In one embodiment of the invention, at least two of the transparent bodies are provided with light splitting or distribution surfaces, one surface acts as the means for directing a portion of the beam of coherent light onto a sub-hologram of the illumination holograms. In addition, the embodiment includes a retrodirective mirror to direct the beam passing through the one light splitting surface at the second light splitting surface which directs a portion onto the storage medium during both the recording and the read out process. In another embodiment or arrangement, the beam of coherent light passing through the deflecting means is directed through one or more transparent bodies, the storage medium and is received by retrodirective mirror which directs the beam onto a sub-hologram of the illumination hologram. The illumination hologram may be disposed in the same plane as the storage medium or may be spaced on an opposite side of a transparent body disposed on the opposite side of the modulator matrix.

DESCRIPTION OF THE PREFERRED EMBODIMENTS

Figure 1:
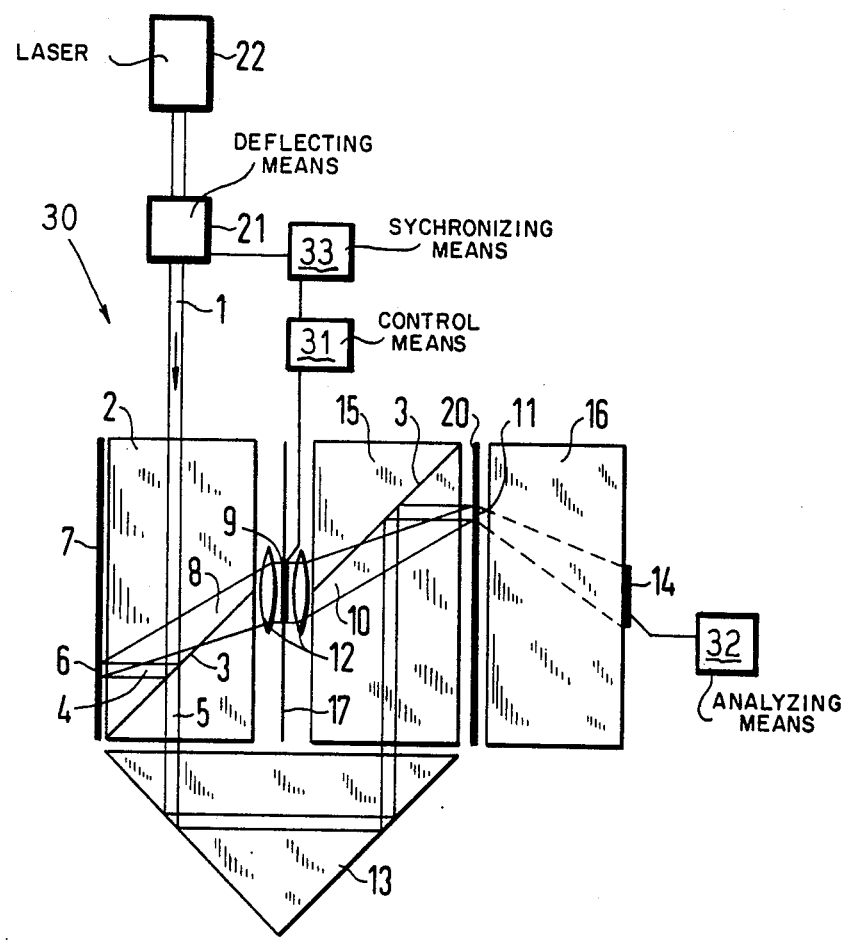
FIG. 1 is a schematic presentation of an arrangement of a device constructed in accordance to the present invention.

The principles of the present invention are particularly useful in a device generally indicated at 30 in the schematic presentation of FIG. 1. The device 30 is capable of both recording information in a holographic form and retrieving the information recorded thereon.

The device 30 includes a source 22, such as a laser, which produces a beam 1 of coherent illumination and directs it through a deflecting means 21 which includes one or more deflecting units with associated controls to enable deflecting the beam 1 in either a single coordinate direction or in both coordinate directions. From the deflecting means 21, the beam 1 is directed at a first transparent body 2, which is a glass block having flat rectangular surfaces and which body contains a light splitting or distribution surface 3. When the beam 1 strikes the surface 3, it is split into a fraction 4 with a portion 5 passing therethrough. The portion 4 is directed onto a sub-hologram 6 of an illumination hologram 7 which is disposed on one surface of the block 2. The sub-hologram 6 produces an illuminating beam or wave 8 which is reflected back through the block or body 2 towards a modulator matrix 9 which modulates the illuminating beam 8 with the information to be recorded and produces an object beam or wave 10 directed onto a position of a sub-hologram 11 which is to be recorded on a storage medium 20. To restrict the illuminating intensity of the object wave 10 to the desired surface area for the sub-hologram 11, a condenser-type optical system 12 is preferably associated with the matrix 9 and, as illustrated, consists of a pair of lenses which condenses the beam 8 as it is projected on the matrix and condenses and focuses the object wave 10 as it is projected on the storage medium 20. The condenser-type optical system, while illustrated as consisting of lenses, may be composed of holograms, kinoforms and fresnel zone plates.

The modulator matrix 9 may be of any arrangement of modulating elements arranged in a grid for light transmitting operations which can spatially modulate information on the illuminating beam 8 to create the object wave or beam 10. Preferably, the matrix is a matrix of a plurality of liquid crystal cells which are controlled by means 31 and which are capable of selectively blocking or allowing passing of distinct spatial portions of the beam 8 to create the object wave 10. Liquid crystal matrixes with associated control means are known in the art. It should also be noted that the means 31 and deflecting means 21 will be synchronized by a suitable device 33 which insures that the desired information is recorded in the desired sub-hologram 11.

When the beam 1 strikes the light splitting surface 3, a portion 5 continues in the direction and leaves the body 2 where it is received by a retroreflective device 13 which is a retrodirective mirror that directs the beam 5 back into a second body 15 which also is a glass block and has a light splitting or distribution surface 3. The path of the beam 5 in body 15 is parallel to the path of beam 1 in the body 2. The body 15 is arranged relative to the body 2 to provide a gap which receives the matrix 9 and the optical system 12. When the beam 5 strikes the splitting surface 3 of the body 15, a portion is reflected out of the body 15 to strike the area of the sub-hologram 11 on the storage medium 20. This portion acts as a reference wave during the holographic recording of the object wave 10. Any portion of the redirected beam which passes through the splitting surface 3 of body 15 leaves the body and is dissipated or lost.

The device 30 also includes a third transparent body 16 which supports a detector matrix 14 which may be a plurality of photo detectors which convert the optical signals into electrical signals which electrical signals are analyzed in an analyzing means 32. During a retrieval or reading out of the sub-hologram 11 on the storage medium 20, the modulator matrix 9 is set into a closing or blocking mode to prevent illumination of the storage medium 20 by the object beam 10. Thus, the only beam striking the sub-hologram 11 is the beam 5 which then acts as a reproduction or retrieval beam. Because of the perpendicular incidence of the beam 5 on the sub-hologram 11, the sub-hologram not only reconstructs a virtual image of the modulator matrix, which virtual image is not utilized, but also after passing through the block 16 produces a real image at the location of the detector matrix 14.

The light splitting or distribution surfaces 3 of bodies 2 and 15 are constructed to have a division ratio of about 1 : 1 so that the intensity of each beam created by the surface 3 is approximately equal. The transparent bodies 2, 15 and 16 are preferably glass blocks or boxes which have the highest possible refractive index which is in any case greater than 1. As disclosed in Gerd Goldmann et al copending United States application, Ser. No. 347,780 filed Apr. 4, 1973, the use of a transparent block having a high refractive index acts as an immersion material to increase the storage density.

Figure 5:
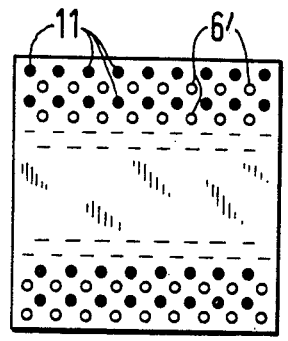
FIGS. 5 and 6 illustrate two examples of the patterns of the sub-holograms of both the illumination hologram and the sub-holograms formed on the storage medium.
Figure 6:
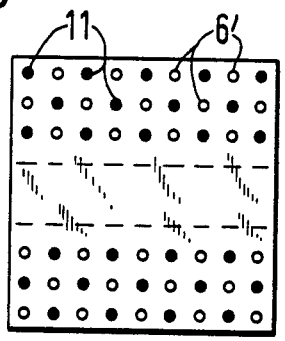

The illumination hologram 7 contains a plurality of sub-holograms 6 which are preferably reflection holograms and the sub-holograms will reflect an unrefracted component of the beam 4 back on itself. To prevent this unrefracted component from causing retrieval of undesignated sub-hologram 11 in the storage medium 20 during a read out operation, the illumination sub-holorams 6 will be conveniently designed as surface-relief holograms with a mirrored external surface and are so dimensioned that the unrefracted component disappears. Another solution to the above problem is to divide the storage medium 20 into an upper and lower half and in each half omit each second position for a sub-hologram 11 so that the sub-hologram pattern in the two halves is staggered in relation to one another and so that the unwanted reflection striking a position 6' (see FIGS. 5 and 6) in all cases strikes empty positions on the storage medium or plate. An additional protective measure is the provision of a perforated mask 17 which has apertures in front of the position for the modulator elements of the modulator matrix 9 so that undesirable disturbing beams are prevented from reaching the storage medium 20.

Figure 2:
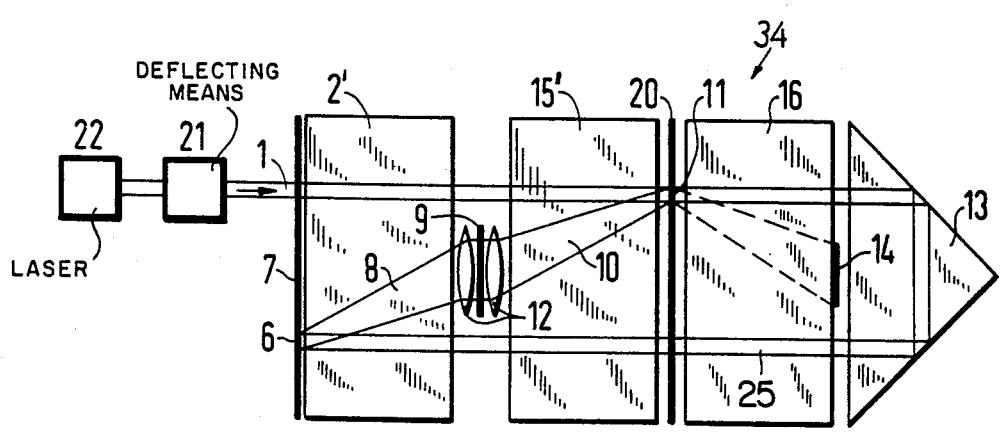
FIG. 2 is a schematic presentation of another arrangement of a device constructed in accordance to the present invention.

Another embodiment or arrangement of the device is generally indicated at 34 in FIG. 2. In this embodiment, each of the stuctural elements of the previous embodiments that are the same are identified by the same element numbers. In the device 34, the deflected beam 1 is directed through the illumination hologram 7, through a transparent body 2', through a transparent body 15' and through the storage medium 20 at the position for the sub-hologram 11. The beam 1 leaving the storage medium 20 passes through a third body 16 and is received by a retroreflection device 13 which is a retrodirective mirror. The device 13, which is a triple reflector, directs the beam back parallel to its original path. The redirected beam 25 passes through the storage medium 20, the block 15', the block 2' to strike a sub-hologram 6 on the illumination hologram 7. As in the previously described embodiment, the sub-hologram 6 is a reflection hologram and produces an illumination beam 8 which is projected onto the modulator matrix 9 which matrix is provided with an optical system 12 for focusing and directing the object beam 10 which is created by the modulation that occurs in the matrix 9 onto the medium 20 at the position 11.

The device 34 doubly exploits the incident beam 1 from the laser and deflecting means. During recording, the beam 1 serves as a reference beam as it projects on the medium 20 and the portion that passes therethrough is then utilized to produce the illumination wave 8 from the sub-hologram 6. During a retrieval or read out operation as in the device 30, the matrix 9 is placed in a blocking mode and only the beam 1 illuminates the sub-hologram 11 to reconstruct the information image at the plane of the detector matrix 14.

A major structural difference of the embodiment or arrangement of the device 34 from the embodiment of the device 30 is that none of the blocks or transparent bodies require the distribution or light splitting surfaces 3 and thus do not have the energy loss which occurs when using these light splitting surfaces. The positions on the medium 20 at which a sub-hologram 11 can be recorded must be staggered to leave open spaces for the redirected beam 25 which returns back through the storage medium 20. Thus, the beam 25 will pass through a position designated 6' in FIGS. 5 and 6 and will not interfere with the recording of sub-holograms at the position designated 11 in the two figures. The sub-holograms 6 of the illumination hologram 7 must be arranged in a pattern which provides open space to enable passage of the beam 1 without any interference. This pattern of sub-holograms 6 may be staggered relative to the pattern of sub-holograms 11 by assuming the position 6' in FIGS. 5 and 6.

Figure 3:
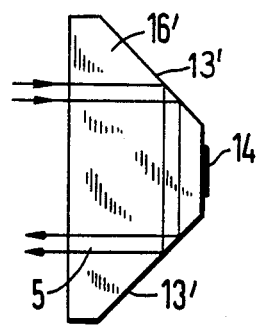
FIG. 3 is an embodiment of the retrodirective mirror which may be used in the arrangement of FIG. 2.

A simplification of the embodiment of FIG. 2 is a combination of the function of the glass bodies 13 and 16. An example of such a combination is illustrated by the glass body 16' in FIG. 3 in which the mirrors or reflecting surfaces 13' terminate in a flat surface located at their apex which surface receives the detector matrix 14. When substituting the body 16' for the body 16, the length of the device of FIG. 2 can be shortened by the length of the member 13.

Figure 4:
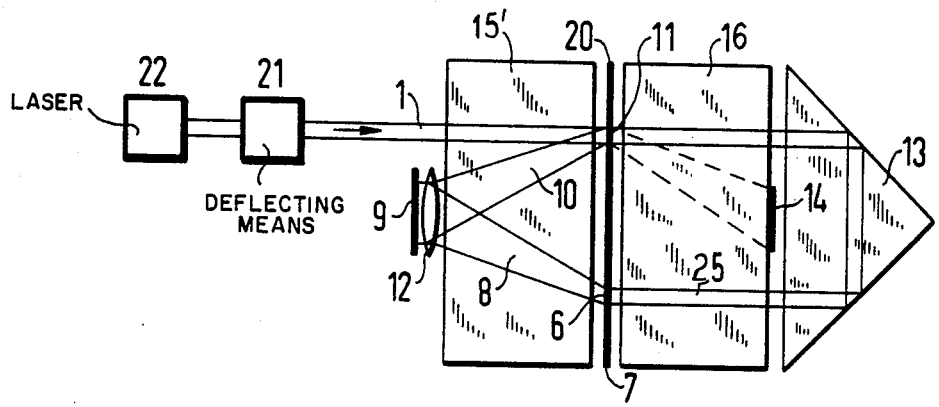
FIG. 4 is another schematic presentation of an embodiment of the arrangment of the device FIG. 2.

In both of the examples of the devices shown in FIGS. 1 and 2, the modulator matrix 9, which is preferably a liquid crystal matrix, operates in transmission and the illumination hologram 7 operates in reflection. In the embodiment of FIG. 4, which operates in a manner similar to that of the embodiment of FIG. 2, the illumination hologram 7 is a transmission hologram and the modulator matrix 9 operates in reflection so that the illumination beam 8 from the sub-hologram 6 strikes the matrix which modulates the beam and reflects it as the object wave 10 onto the storage medium 20. In this embodiment, the illumination hologram 7 is disposed in the same plane with the storage medium 20 and can be formed on the same carrier therewith. However, it is convenient to use two different hologram carriers because the two type of holograms must satisfy different requirements. When the illumination hologram 7 and the storage medium 20 are disposed in the same plane, the sub-holograms 11 which contain the information being recorded must be recorded in a pattern, such as illustrated in either FIGS. 5 and 6, and the sub-holograms 6 of the illumination hologram 7 must be in a pattern illustrated at 6' in either FIGS. 5 and 6. These two patterns are staggered so that there is no interference therebetween. In the embodiment of FIG. 4, a glass body 16 can be replaced by the body 16' of FIG. 3 so that the overall length of the device is further reduced.

In order to fully exploit the power or intensity of illumination of the illuminating wave or beam 8, it is desirable that the surface of the modulator matrix 9 is not uniformly illuminated, but is only illuminated at the points of the apertures of the matrix. To accomplish this, each of the sub-holograms 6 of the illumination hologram 7 produces a pattern of individual beams which form a pattern of spots or points on the modulator matrix 9 with the spots being located at the apertures of the modulator elements and which pattern corresponds to a pattern of spots passed by the modulator 9 when all elements are exhibiting a binary 1 unit. Because the condenser-type optical system 12 can exhibit abberations when the angle of the illumination beam vis-a-vis the optical axis exceeds a specific characteristic value for a particular optical system 12, it is desirable when constructing the sub-holograms 6 of illumination hologram 7 to compensate for these abberations by introducing a preliminary distortion.

As mentioned above, the using of the high capacity holographic storage device of the present invention enables the recording of electrically supplied information on a storage medium and the retrieving of the recorded holograms without repositioning or moving the storing medium. In the device of the present invention, it is particularly desirable to use as the storage medium 20 a material which does not require wet development. Examples of such materials are thermoplastics, and erasable storage materials.

It should be pointed out that in each of the embodiments, as the beam 1 is deflected from position to position to strike different positions of the storage medium 20, the fraction 4 or the redirected beam 25 strikes a different sub-hologram 6 of the illumination holograms. Each of the sub-holograms 6 is produced so that the reproduced wave or illumination wave 8 is directed at the modulator matrix 9 and either passes therethrough or is reflected thereby to hit the desired position for the sub-hologram 11 which is being recorded.

Although various minor modifications might be suggested by those versed in the art, it should be understood that I wish to employ within the scope of the patent warranted hereon all such modification as reasonably and properly come within the scope of my contribution to the art.

I claim:

1. A device for recording information in a holographic storage and for retrieving the information from the storage, comprising at least one transparent body having flat rectangular surfaces, a storage medium positioned adjacent a flat surface of said one body, a source providing a beam of coherent illumination directed through said one body onto the storage medium, means selectively deflecting the beam onto different portions of the storage medium; a retrodirective mirror positioned to receive the beam passing through the storage medium, an illumination hologram containing a plurality of sub-holograms positioned to be in the path of the beam from the retrodirective mirror, a detector matrix spaced from the storage medium, and a modulator matrix disposed adjacent a surface of said one body opposite said storage medium, said modulator matrix being associated with a condensing optical system for receiving an illuminating beam reconstructed by the redirected beam impinging on a sub-hologram of the illumination hologram and focusing an object beam created from the illuminating beam by the modulator matrix onto the storage medium to record a hologram thereon.

2. A device according to claim 1, wherein the illumination hologram is disposed in the plane of the storage medium and wherein the modulating matrix is a reflective matrix.

3. A device according to claim 2, wherein the retrodirective mirror has a flat surface disposed between the pair of mirror surfaces which is parallel to the storage medium and on which the detector matrix is disposed.

4. A device according to claim 2, wherein the sub-holograms of the illumination holograms are arranged in a pattern and the sub-holograms recorded on the storage medium are arranged in a pattern with the two patterns being in staggered relation to one another.

5. A device according to claim 1, wherein a second transparent body is arranged on the opposite side of the modulator matrix and wherein the illumination hologram is disposed on the surface of the second transparent body removed from the modulator matrix so that the beam of coherent illumination passes through the illumination hologram, the second transparent body before entering said one transparent body.

6. A device according to claim 5, wherein the sub-holograms of the illumination hologram are arranged in a pattern and wherein the holograms recorded on the storage medium are arranged in a pattern with the two patterns being in a staggered relationship.

7. A device according to claim 6, wherein the sub-holograms of the illumination holograms are reflective holograms and wherein the modulator matrix is a transparent liquid crystal matrix.

8. A device according to claim 1, wherein the sub-holograms of illumination hologram are designated to project a plurality of spots on the matrix of liquid crystals.

9. A device according to claim 1, wherein a third transparent body is disposed between the storage medium and the retrodirective mirror and wherein the detector matrix is disposed on the surface of the third transparent body adjacent the retrodirective mirrors.

10. A device according to claim 1, wherein the retrodirective mirror is disposed adjacent the storage medium and has a flat surface between the mirror surfaces and wherein the detector matrix is disposed thereon.

* * * * *